US006657268B2

(12) United States Patent
Besser et al.

(10) Patent No.: US 6,657,268 B2
(45) Date of Patent: Dec. 2, 2003

(54) METAL GATE STACK WITH ETCH STOP LAYER HAVING IMPLANTED METAL SPECIES

(75) Inventors: Paul R. Besser, Austin, TX (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/228,045

(22) Filed: Aug. 27, 2002

(65) Prior Publication Data

US 2003/0003645 A1 Jan. 2, 2003

Related U.S. Application Data

(62) Division of application No. 09/810,348, filed on Mar. 19, 2001, now Pat. No. 6,444,513.

(51) Int. Cl.[7] .............................................. H01L 29/76
(52) U.S. Cl. ...................... 257/410; 257/407; 257/411; 257/412; 257/57; 257/58; 438/195; 438/203; 438/216; 438/218; 438/303; 438/592
(58) Field of Search ............................... 438/195, 203, 438/216, 218, 303, 592; 257/407, 411, 412, 57, 58

(56) References Cited

U.S. PATENT DOCUMENTS

| | | | |
|---|---|---|---|
| 5,468,662 A | 11/1995 | Havemann | 437/40 |
| 5,618,760 A | 4/1997 | Soh et al. | 148/DIG. 46 |
| 5,905,274 A | 5/1999 | Ahn et al. | 257/59 |
| 6,001,716 A | 12/1999 | Liao | |
| 6,383,879 B1 * | 5/2002 | Kizilyalli et al. | 438/303 |
| 6,444,512 B1 * | 9/2002 | Madhukar et al. | 438/203 |

FOREIGN PATENT DOCUMENTS

TW                471049              1/2002

OTHER PUBLICATIONS

G.C. Schwartz et al., "Reactive Ion Etching of Copper Films", J. Eelctrochem, Soc.: Accelerated Brief Communication, vol. 130, No. 3, Aug. 1983, pp. 1777–1779.
K. Tokunaga et al., "Aluminum Etching in Carbon Tetrachloride Plasmas", J. Electrochem. Soc.: Solid–State Science and Technology, vol. 127, No. 4, Apr. 1980, pp. 928–932.
J.C. Hu et al., "Feasibility of Using W/TiN as Metal Gate for Conventional 0.13 $\mu$m CMOS Technology and Beyond", IEDM97–825, pp. 33.2.1–33.2.4.
J. Miao et al., "The Use of Ion Implantation for Micromachining GaAs for Sensor Applications", Elsevier Sciences S.A., vol. 46, No. 1–3, Jan. 1995, pp. 30–34.
Kent D. Choquette et al., "Dry Lithography Using Focused Ion Beam Implantation and Reactive Ion Etching $SiO_2$", Applied Physics Letter 62 (25), Jun. 21, 1993, pp. 3294–3296.

* cited by examiner

*Primary Examiner*—David Nelms
*Assistant Examiner*—Mai-Huong Tran

(57) ABSTRACT

A metal gate structure and method of forming the same introduces metal impurities into a first metal layer, made of TiN, for example. The impurities create a surface region of greater etch selectivity that prevents overetching of the TiN during the etching of an overlying tungsten gate during the formation of the metal gate structure. The prevention of the overetching of the TiN protects the gate oxide from undesirable degradation. The provision of aluminum or tantalum as the metal impurities provides adequate etch stopping capability and does not undesirably affect the work function of the TiN.

10 Claims, 5 Drawing Sheets

METAL GATE STACK WITH ETCH STOP LAYER HAVING IMPLANTED METAL SPECIES

RELATED APPLICATIONS

This application is a divisional of U.S. patent application Ser. No. 09/810,348, filed Mar. 19, 2001 now U.S. Pat. No. 6,444,513 and contains subject matter similar to that disclosed in U.S. application Ser. No. 09/824,218, filed Apr. 3, 2001.

FIELD OF THE INVENTION

The present invention relates to the field of semiconductor processing, and more particularly to the formation of metal gate electrodes.

BACKGROUND OF THE INVENTION

In the integrated circuit (IC) industry, metal-oxide semiconductor (MOS) transistors have typically been formed utilizing polysilicon gate electrodes. Polysilicon material has been preferred for use as an MOS gate electrode due to its thermal resistive properties (i.e., polysilicon can better withstand subsequent high-temperature processing). Polysilicon's robustness during high-temperature processing allows polysilicon to be annealed at high temperatures along with source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for the high resistance, polysilicon materials often require extensive and expensive silicide processing in order to increase their speed of operation to acceptable levels.

Metal gates are therefore being investigated as replacements for polysilicon gates. Metal gates are fabricated in a manner that is similar to the fabrication processes for polysilicon gates. An exemplary layer structure is depicted in FIG. 1A of a metal gate structure. Gate oxide layer 12 is first deposited on a substrate 10. A barrier layer 14, made of titanium nitride (TiN), for example, is formed on the gate oxide layer 12. The layer 14 is primarily chosen for appropriate workfunction properties which determine the threshold voltage of the transistor structure. The barrier layer also aids in the adhesion of the subsequently formed metal gate. The TiN can be deposited by conventional methodologies, such as physical vapor deposition (PVD). Alternate materials such as TaN, $TaS_xN_y$, WN etc. may be used for this purpose A metal gate layer 16 is then formed on the barrier layer 14. An exemplary material for the metal gate layer 16 is tungsten, although other materials may be used. The tungsten is deposited by conventional methodologies, such as physical vapor deposition.

A SiRN anti-reflective coating (ARC) 18 is formed on the metal gate layer 16. This is followed by formation of a cap layer 20 over the ARC layer 18. The cap layer 20 may comprise silicon nitride (SiN), for example. The anti-reflective coating 18 and the cap layer 20 aid in the patterning of the gate prior to the reactive ion etch process used to form the gate. Anti-reflective coatings 18, 20 increase the resolution during the lithography process.

After the deposition of the layers 12–20 over the substrate 10, the metal gate is now etched. This is accomplished by conventional patterning and etching techniques. The tungsten layer is typically etched with a fluorine containing chemistry, such as $SF_6/N_2$ or $SF_6/Cl_2/N_2$, with $WF_6$ being the primary product species. The latter chemistry has yielded good profiles. In the latter case, an appropriate $SF_6/Cl_2$ ratio may be chosen to provide the best profiles. The recipe may even be richer in $Cl_2$ than in $SF_6$ as required. It is desirable for the etchant to have good selectivity to the TiN of the barrier layer 14 so that the tungsten can be cleared across the entire wafer without attacking the gate oxide. Hence, the TiN ideally serves as an etch stop layer during the etching of the tungsten. An ideal etching process is depicted in FIG. 1B, which shows the patterning of the metal gate electrode by an anisotropic reactive ion etch process, stopping on the TiN at the barrier layer 14. However, this depiction is only an ideal depiction, as the TiN has proven in practice to be an inadequate etch stop layer. As depicted in FIG. 1C, when the tungsten is being cleared from the rest of the wafer, the TiN is completely etched on some parts of the wafer (indicated by reference numeral 22 in FIG. 1C) allowing the etchant to attack the gate oxide 12. This occurs because TiN readily etches in the $Cl_2$ containing W etch chemistry. This results in the gate oxide being exposed either to the F from the W chemistry or being subject to the Cl-based TiN chemistry for the course of the TiN etch, both of which result in damage to the gate oxide. The use of endpoint monitors such as optical emission from W species to stop the W etch from proceeding once the W film clears also does not reliably solve this problem, since the thin TiN film continues to etch quickly while the endpoint is being detected. Thus, even though a TiN etch selective to gate oxide may be employed when W endpoint is detected, the attack of TiN during the W etch process itself makes this approach unreliable in practice. Simply increasing the TiN thickness itself is not practical owing to increases in stress leading to possible delamination and/or an increase in sheet resistance. The complete etching away of the TiN during the tungsten etch leads to degraded gate oxide and decreased yield.

Replacing the TiN with different etch stop material may detrimentally affect the work function of the TiN, and such etch stop material may not exhibit the adhesion properties that are desirable in the TiN. However, there is a need for improved structure that allows the etching of tungsten with a $Cl_2/SF_6/N_2$ process that properly stops on the etch stop layer and protects the gate oxide across the wafer, without detrimentally affecting the work function of the metal gate.

SUMMARY OF THE INVENTION

This and other needs are met by embodiments of the present invention which provide a method of forming a metal gate on a wafer, comprising the steps of forming a gate oxide on a substrate and forming a first metal layer on the gate oxide. The etch selectivity in at least a surface region of the first metal layer is increased. A second metal layer is formed on the first metal layer. The second metal layer is then etched to form a metal gate, with the etching stopping on the surface region of the first metal layer.

In certain embodiments of the invention, the first metal layer comprises TiN and the etch selectivity is increased by implanting a metallic species into the TiN. In certain embodiments of the invention, the metallic species comprises either aluminum or tantalum, depending on the nature of the W etch chemistry. If the W etch chemistry is F-rich, aluminum may be used as the etch stop layer owing to the low vapor pressure of $AlF_3$. On the other hand, if the W etch chemistry is Cl-rich, the much lower vapor pressure of $TaCl_5$ as opposed to $TaF_5$, $WF_6$ and $TiCl_4$ will also result in a significant slowdown of the etch rate, allowing the etch to be terminated when clearing of W is detected. The surface region of the TiN, containing the implanted metallic species, has better etch selectivity than the region of TiN that does not contain the metallic species. The etch selectivity is thereby improved without additional layers, and without significantly affecting the work function of the TiN. Hence, the etching of the tungsten may proceed and stop on the TiN layer, thereby assuredly protecting the gate oxide underlying the etch stop layer and the TiN of the first metal layer. A similar approach may also be used when TaN, TaSiN or WN for example are used as the underlying metal gates, since the F-component of the W etch will readily attack these materials as well as gate oxide. The use of an aluminum implanted layer will provide a chance to switch to $Cl_2$ based etches with suitable additives such as HBr, $O_2$ or $N_2$, where the etch rate of these materials is much lower and also results in increased selectivity to gate oxide materials.

The earlier stated needs are also met by another embodiment of the present invention, which provides a metal gate structure comprising a gate oxide and a first metal layer on the gate oxide. The first metal layer has a surface region with greater etch selectivity than a remaining region of the first metal layer. A second metal layer is on the first metal layer. In certain embodiments of the invention, the first metal layer comprises TiN, and the second metal layer comprises tungsten. In certain embodiments, the TiN has implanted metal in the surface region, this metal comprising tantalum in some embodiments and aluminum in other embodiments.

The earlier stated needs are also met by further embodiments of the present invention, which provide a metal gate structure comprising a TiN layer having a lower region and a surface region with metal impurities. The surface region has greater etch selectivity than the lower region. A tungsten gate is provided on the TiN layer.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of metal gate structures, in particular, to those involved in the etching of a metal gate causing the possible degradation of gate oxide across a wafer. These and other problems are solved, in part, by the present invention which increases the etch selectivity of the TiN currently used in metal gates. This is achieved, in embodiments of the invention, by implanting a metallic species, such as aluminum or tantalum, into a surface region of the TiN. In etching the tungsten or other metal of a metal gate, the TiN with a surface region of increased etch selectivity stops the etching better than the TiN of the prior art. This prevents etching through of the TiN and degrading of the gate oxide across the wafer. Since implantation is employed to increase the etch selectivity of the TiN, a separate, additional etch stop layer is not required, so that the stack height is not appreciably altered. Some increase of the TiN layer from before may be required to compensate for the finite thickness of the implanted region, if electrical constraints determine that a certain thickness of unmodified TiN is required to define the gate structure. The improved TiN layer provides adequate etch stopping capability and the implanted metallic species does not detrimentally affect the work function of the TiN. The implanted species must itself be etchable in chemistries other than that used for the W etch. For example, Al can be etched in Cl based chemistries, and Ta can be cleared either by a short F based breakthrough or a longer Cl based step.

Figure 1A:
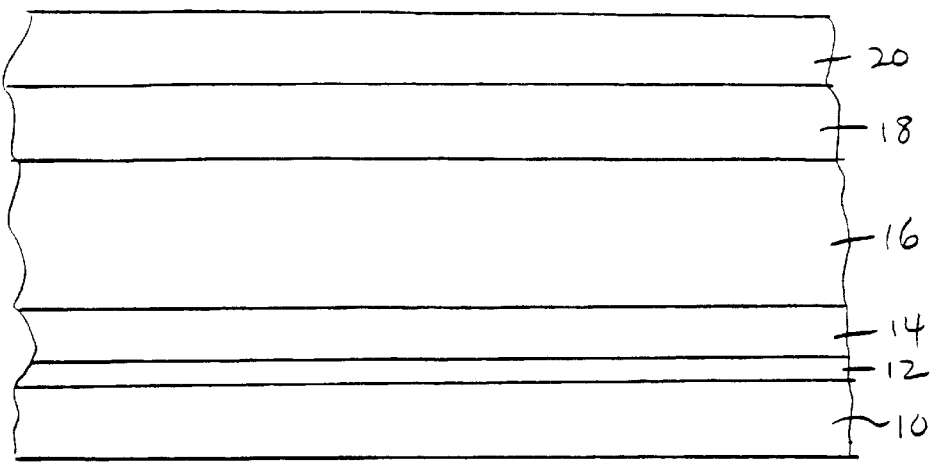
FIG. 1A depicts a metal gate stack prior to the patterning of the metal gate, in accordance with the prior art.
Figure 1B:
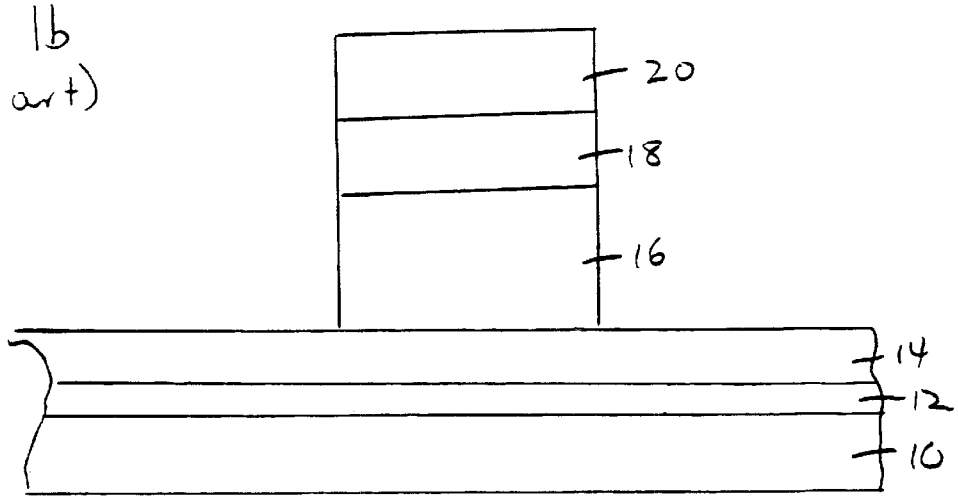
FIG. 1B depicts a metal gate after an ideal etching process in accordance with the prior art.
Figure 1C:
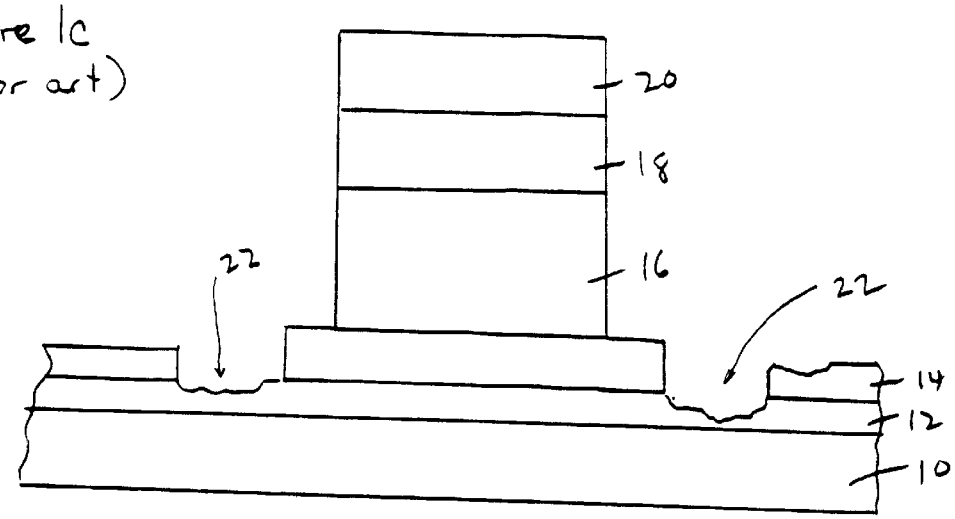
FIG. 1C depicts the metal gate after an actual etching process, exhibiting areas of degraded gate oxide, in accordance with methods of the prior art.
Figure 2:
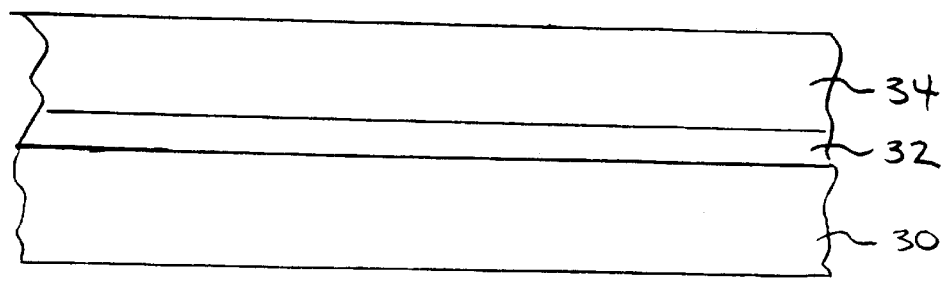
FIG. 2 is a depiction of a cross-section of a portion of a metal gate structure during formation of the metal gate, in accordance with embodiments of the present invention.

FIG. 2 depicts a portion of a metal gate structure during its formation in accordance with embodiments of the present invention. A substrate 30 is provided with a gate oxide layer 32 by conventional methodology. The gate oxide layer 32 has a thickness of between about 15 to about 30 Å in embodiments of the present invention. A first metal layer 34 is formed on the gate oxide layer 32. The first metal layer 34 may comprise TiN, in certain embodiments of the present invention, although other metals may be used. The TiN is deposited by conventional methodologies, such as physical vapor deposition, for example. The thickness of the first metal layer 34 may be between about 100 to about 200 Å in embodiments of the present invention. The first metal layer 34 serves as a barrier layer and an adhesion layer, in certain embodiments. In the prior art, the TiN metal layer served the function of an etch stop layer. It has been found, however, that untreated TiN is inadequate in this function as it fails to protect the underlying gate oxide across the wafer during the etching of the overlying metal gate layer.

Figure 3:
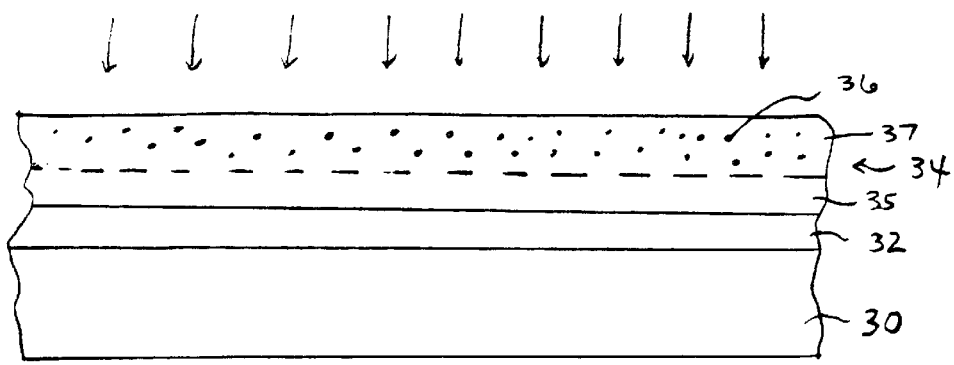
FIG. 3 depicts the structure of FIG. 2 after implantation of ions into a surface region of a first metal layer of the metal gate structure, in accordance with embodiments of the present invention.

In order to improve the etch stopping capability during the tungsten etch and protect the underlying gate oxide across the wafer, the first metal layer 34 is treated to improve the etch selectivity of at least a surface region of the layer 34. As depicted in FIG. 3, the present invention introduces metal impurities 38 into at least a surface region 37 of the first metal layer 34. Depending on the implant energies, the surface region 37 may extend completely through the first metal layer 34. In other embodiments of the invention, such as that depicted, the surface region 37 extends only through a portion of the first metal layer 34. In such embodiments, a lower region 35 of the first metal layer 34 contains little or none of the impurities 38.

Based upon vapor pressure tables and other considerations, the metallic species 36 introduced into the TiN of the first metal layer 34 may be one or more of a number of different materials. Candidates for the metallic species include aluminum, tantalum, copper, and gold. Of these materials, aluminum and tantalum are favored, since copper and gold have deleterious effects on transistors. Aluminum forms a stable nonvolatile fluoride $AlF_3$ at typical cathode temperatures (50° C.) and can adequately stop F-containing W etch chemistries. Tantalum chloride has a much lower vapor pressure than $TaF_5$ and $WF_6$ and can appreciably slow down the etch rate in $Cl_2$-rich $SF_6/Cl_2/N_2$ tungsten etch chemistries. Although aluminum and tantalum are described as exemplary metallic species in the first metal layer 34, other materials or combinations of materials may be used without departing from the scope of the present invention.

In certain embodiments of the present invention, an ion implantation process is employed to introduce the metallic species 36 into the surface region 37 of the first metal layer 34. An exemplary ion implantation process for aluminum or tantalum metallic species uses a beam current density of between about 20–40 E10 ions/cm$^2$. The ions are implanted, in certain exemplary embodiments, with low power, such as less than 1000 eV. An exemplary power is about 100 eV. These process parameters are exemplary only, and may be changed depending on the material of the first metal layer 34, the metallic species 36 to be implanted, the etch selectivity required, etc., and other parameters known to those of skill in the art.

The use of implantation to increase the etch selectivity of a surface region 37 of the first metal layer 34 does not affect the height of the metal gate stack, increases the etch stopping capability of the first metal layer 34, and does not significantly impact the work function of the TiN in the first metal layer 34.

Figure 4:
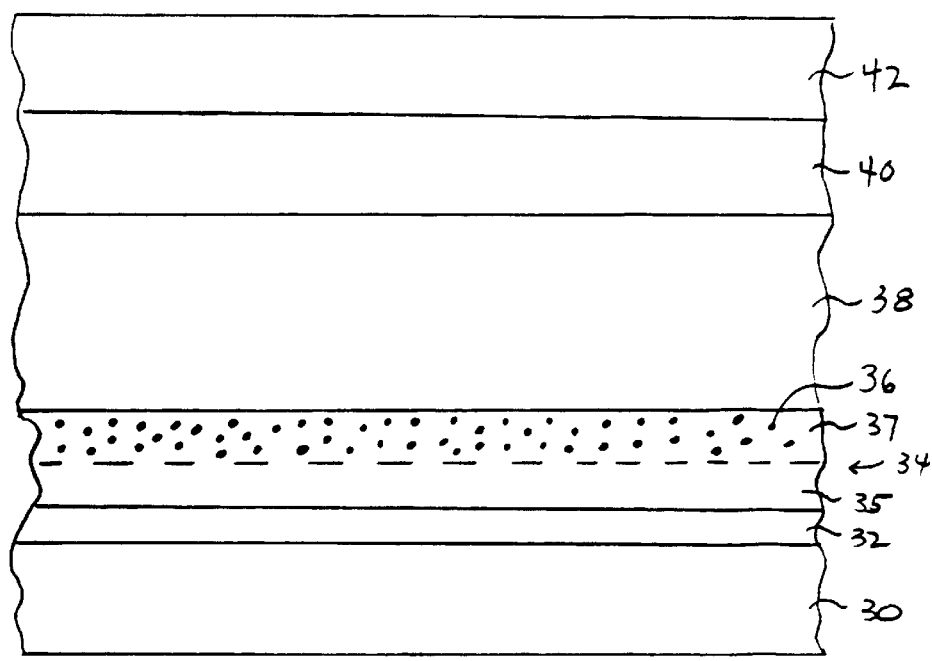
FIG. 4 depicts the structure of FIG. 3 following the deposition of the metal gate and anti-reflective coatings, in accordance with embodiments of the present invention.

Referring to FIG. 4, the remainder of the metal gate structure is provided on the first metal layer 34. This includes the metal gate, formed by tungsten deposited by PVD, for example. Tungsten may be deposited as a second metal layer 38 to a thickness of between about 500 to about 1,000 Å. Although tungsten is described as an exemplary material, other metals or metal alloys may be employed in the second metal layer 38.

Anti-reflective coatings, such as an SiRN ARC 40, are provided on the second metal layer 38. A cap layer 42 is then formed over the ARC layer 40. The ARC layer 40 may be between about 300 to about 1,000 Å. The cap layer 42, which may be silicon nitride (SiN), for example, may be between about 300 to about 1,000 Å. The anti-reflective coating of layer 40 and the cap layer 42 aid in the patterning of the metal gate structure.

Figure 5:
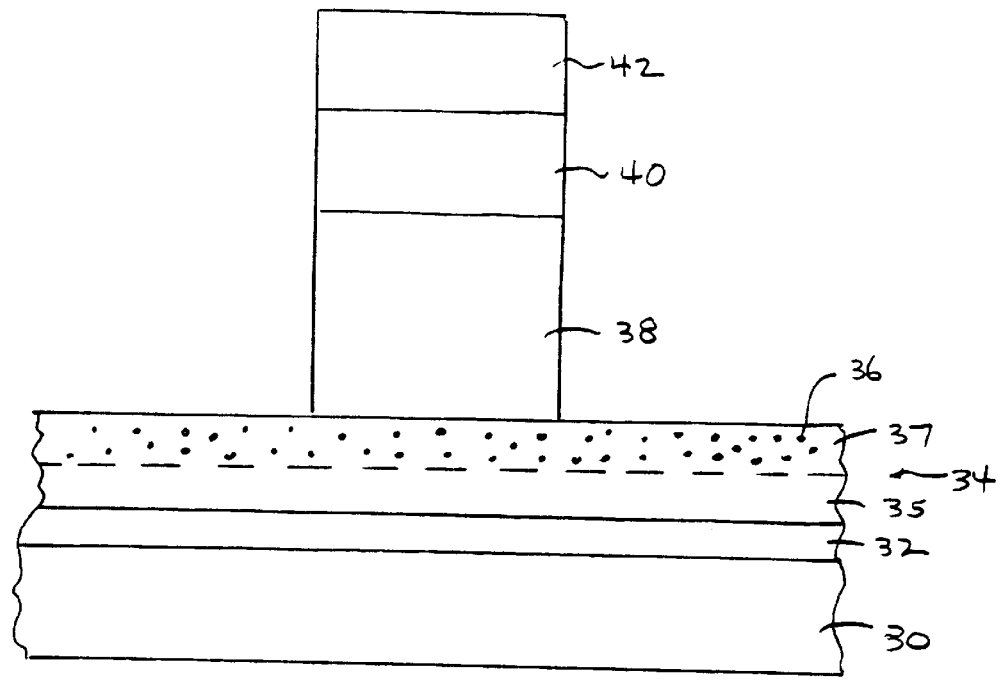
FIG. 5 depicts the structure of FIG. 4 after etching has been performed to etch the metal gate and first metal layer, in accordance with embodiments of the present invention.

Following the formation and patterning of a resist mask, the metal gate is etched, the results of which are depicted in FIG. 5. A reactive ion etch process, which is an anisotropic etch, is performed. As in conventional methodologies, the tungsten in the second metal layer 38 is preferably etched with a $Cl_2/SF_6/N_2$ process, which currently provides the best tungsten profiles. Such a process, however, has difficulties stopping on a conventional TiN layer, such as the first metal layer 34 prior to implantation of the metallic species 36. Undesirable complete etching of the TiN on some parts of the wafer would lead to degraded gate oxides. The improved etch selectivity of the TIN of the first metal layer 34 in the surface region 37, as provided by the present invention, however, prevents this unintended etching through to the gate oxide layer 32. Hence, the etching process proceeds until the surface region 37 of the first metal layer 34 is reached. If aluminum is used as the implanted species, the etching effectively stops due to formation of a stable, non-volatile $AlF_3$-rich layer at typical cathode temperatures (50° C.). Alternately, if tantalum is used as the implanted species while using a $Cl_2$-rich $Cl_2/SF_6/N_2$ tungsten etch chemistry, the etching slows down appreciably due to the much lower vapor pressure of $TaCl_5$ as compared to $TaF_5$ or $WF_6$. This permits termination of the W etch before any attack of underlying TiN occurs. The complete etching of the TiN of the first metal layer 34 and degradation of the gate oxide in the gate oxide layer 32 is thereby prevented.

Figure 6:
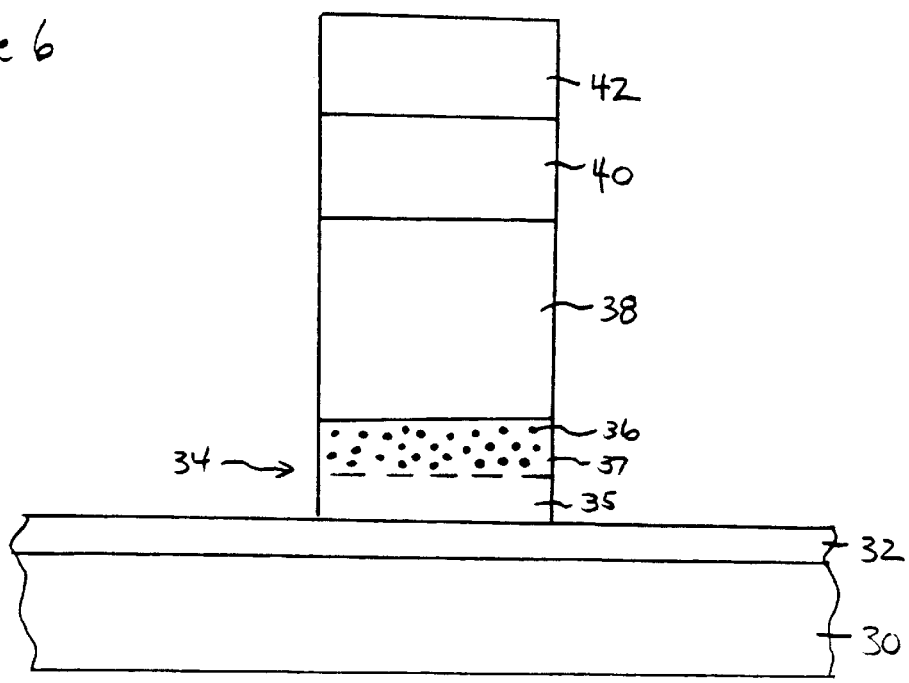
FIG. 6 depicts the metal gate structure of FIG. 5 after the first metal layer has been removed across the wafer in accordance with embodiments of the present invention.

A different etch chemistry is now employed, as depicted in FIG. 6, to remove the first metal layer 34 over the gate oxide 32 in areas not under the second metal layer 38 of the metal gate. In other words, the first metal layer 34 is etched across the wafer except within the metal gate structure. The etching, however, can be precisely controlled to prevent degradation of the gate oxide. Suitable etchants for etching the TiN of the first metal layer 34 are well known to those of ordinary skill in the art and may be appropriately selected.

Figure 7:
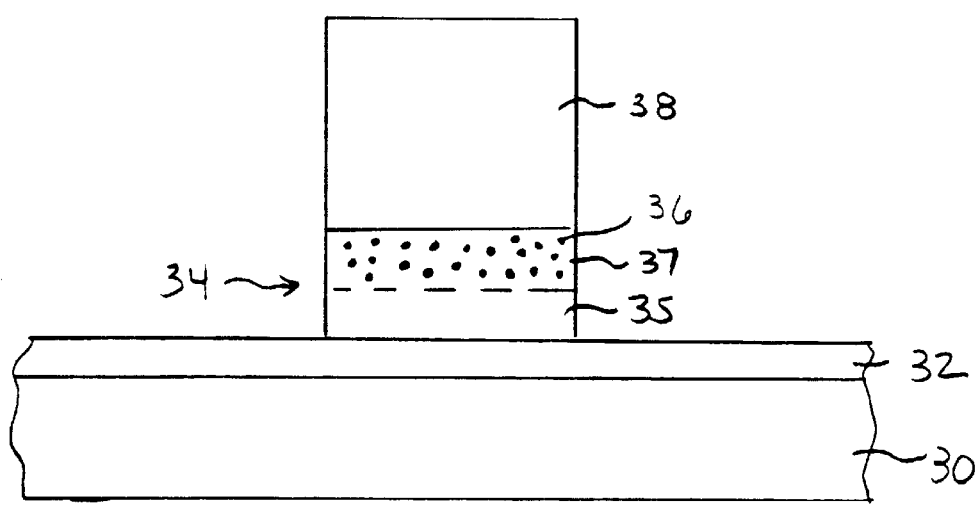
FIG. 7 depicts the metal gate structure of FIG. 6 after the anti-reflective coatings have been removed in accordance with embodiments of the present invention.

FIG. 7 depicts the metal gate structure of FIG. 6 after the cap layer 42 and the anti-reflective coating 40 have been removed by conventional etching techniques. This leaves a metal gate structure that has a gate oxide, a PVD layer of TiN with implanted metal impurities, and a metal gate layer. The TiN layer with improved etch selectivity protects the gate oxide across the wafer during the etching of the metal gate and serves to improve the yield. At the same time, the height of the metal gate stack is unchanged and the work function of the TiN is not deleteriously affected.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A metal gate structure, comprising:
    a gate oxide;
    a first metal layer on the gate oxide; the first metal layer having a surface region with greater etch selectivity than a remaining region of the first metal layer; and
    a second metal layer on the first metal layer.

2. The metal gate structure of claim 1, wherein the first metal layer comprises TiN with implanted metal in the surface region.

3. The metal gate structure of claim 2, wherein the metal is aluminum or tantulum.

4. The metal gate structure of claim 3, wherein the second metal layer comprises tungsten.

5. A metal gate structure comprising:
    a TiN layer having a lower region and a surface region with metal impurities, the surface region having greater etch selectivity than the lower region; and
    a tungsten gate on the TiN layer.

6. The metal gate structure of claim 5, wherein the metal impurities comprise aluminum.

7. The metal gate structure of claim 6, wherein the metal impurities comprise tantulum.

8. The metal gate structure of claim 5, wherein the metal impurities are implanted metal ions.

9. The metal gate structure of claim 8, wherein the implanted metal ions comprise aluminum ions or tantulum ions.

10. The metal gate structure of claim 8, wherein the surface region of the TiN has greater etch selectivity of $Cl_2/SF_6/N_2$ than the lower region.

* * * * *